United States Patent
Lee

(10) Patent No.: US 8,643,143 B2
(45) Date of Patent: Feb. 4, 2014

(54) SEMICONDUCTOR DEVICE AND METHOD OF FABRICATING THE SAME

(75) Inventor: Chang Eun Lee, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 79 days.

(21) Appl. No.: 13/355,022

(22) Filed: Jan. 20, 2012

(65) Prior Publication Data

US 2013/0049167 A1    Feb. 28, 2013

(30) Foreign Application Priority Data

Aug. 30, 2011   (KR) .................. 10-2011-0087082

(51) Int. Cl.
*H01L 29/00*    (2006.01)
(52) U.S. Cl.
USPC ............... 257/536; 257/528; 257/E27.047; 257/E27.116

(58) Field of Classification Search
USPC ............... 257/528, 536, E27.047, E27.116
See application file for complete search history.

(56) References Cited

U.S. PATENT DOCUMENTS 6,919,984 B2 *    7/2005    Wall et al. ............... 359/291

* cited by examiner

*Primary Examiner* — Andy Huynh
(74) *Attorney, Agent, or Firm* — Sherr & Jiang, PLLC

(57) ABSTRACT

Provided is a semiconductor device including a metal dummy pattern and a thin film resistor. In detail, a semiconductor device includes a semiconductor substrate, a thin film resistor, and a metal dummy pattern. The thin film resistor disposed over the semiconductor substrate and extending in a first direction relative to the semiconductor substrate. The metal dummy pattern disposed between the semiconductor substrate and the thin film resistor, the metal dummy pattern including a reflective pattern extending in the first direction semiconductor substrate and spatially corresponding to a periphery of the thin film resistor.

17 Claims, 5 Drawing Sheets

US 8,643,143 B2

SEMICONDUCTOR DEVICE AND METHOD OF FABRICATING THE SAME

CROSS-REFERENCE TO RELATED APPLICATIONS

The present application claims priority under 35 U.S.C. 119 and 35 U.S.C. 365 to Korean Patent Application No. 10-2011-0087082 (filed on Aug. 30, 2011), which is hereby incorporated by reference in its entirety.

BACKGROUND

Embodiments relate to a semiconductor device including a metal dummy pattern and a thin film resistor (TFR), and a method of fabricating the semiconductor device.

Passive devices perform important functions in an electronic system. Recently, the making of miniaturized, multifunctional, and economical electronic appliances is giving rise to requirements for passive devices to be fabricated in the form of an array, a network, and a built-in passive device that is recently popular. Such passive devices sense, monitor, transmit, reduce, and control voltage.

Resistors as passive devices suppress a flow of electric charge current, thereby controlling the amount of current. Such resistors may be classified into a thin film resistor including a pattern formed with a deposited thin metal layer, and an active layer resistor including an active layer region. Such a thin film resistor is disposed between metal lines of a semiconductor device.

When a semiconductor device is fabricated, a metal dummy may be added to reduce a density difference of a metal on a semiconductor substrate and prevent a high difference during a chemical mechanical polishing (CMP) process, thereby forming a uniform array.

FIG. 1 is a plan view and a cross-sectional view illustrating a semiconductor device including a metal dummy and a thin film resistor in the related art. Referring to FIG. 1, the semiconductor device includes a semiconductor substrate 10, a first dielectric 20 disposed on the semiconductor substrate 10, a lower metal line 30 disposed on the first dielectric 20, and a metal dummy pattern 40 randomly formed. A second dielectric 50, a thin film resistor 60, a third dielectric 70, an upper metal line 80, and a via 90 may be sequentially formed on the lower metal line 30 and the metal dummy pattern 40.

While the semiconductor device is fabricated, the thin film resistor 60 may have an irregular pattern profile according to whether a metal dummy is disposed under the thin film resistor 60. That is, when a metal dummy is randomly formed, and then an exposure process is performed to form the thin film resistor 60 on the metal dummy, a portion of light may pass through the thin film resistor 60 having a small thickness. The light passing through the thin film resistor 60 is reflected by the metal dummy disposed under the thin film resistor 60, thus deforming a line of the thin film resistor 60.

FIG. 2 is an image illustrating a slope of a thin film resistor formed as described above. Referring to FIG. 2, while a portion of the thin film resistor in a region corresponding to a metal dummy pattern is uniform in slope, a portion of the thin film resistor out of the region corresponding to the metal dummy pattern is decreased in slope.

That is, referring to FIGS. 1 and 2, in a method of fabricating a semiconductor device including a metal dummy pattern and a thin film resistor in the related art, the thin film resistor may have an irregular pattern profile to jeopardize uniformity thereof, and thus, a resistance value required by a designer may not be satisfied.

SUMMARY

Embodiments provide a semiconductor device including a thin film resistor that has a regular pattern profile to obtain a desired resistance value.

In one embodiment, a semiconductor device includes: a semiconductor substrate; a thin film resistor disposed on the semiconductor substrate and extending in a first direction; and a metal dummy pattern disposed between the semiconductor substrate and the thin film resistor, wherein the metal dummy pattern includes a reflective pattern extending in the first direction and corresponding to a periphery of the thin film resistor.

In another embodiment, a semiconductor device includes: a first dielectric disposed on a semiconductor substrate; a lower interconnection and a metal dummy pattern, which are disposed on the first dielectric; a second dielectric disposed on the lower interconnection and the metal dummy pattern; a thin film resistor disposed on the second dielectric and having first to fourth peripheries; an upper interconnection disposed on the thin film resistor; and a via passing through the second dielectric and connecting the lower interconnection to the upper interconnection. The metal dummy pattern includes a reflective pattern corresponding to the first to fourth peripheries of the thin film resistor.

The details of one or more embodiments are set forth in the accompanying drawings and the description below. Other features will be apparent from the description and drawings, and from the claims.

DETAILED DESCRIPTION OF THE EMBODIMENTS

Figure 1:
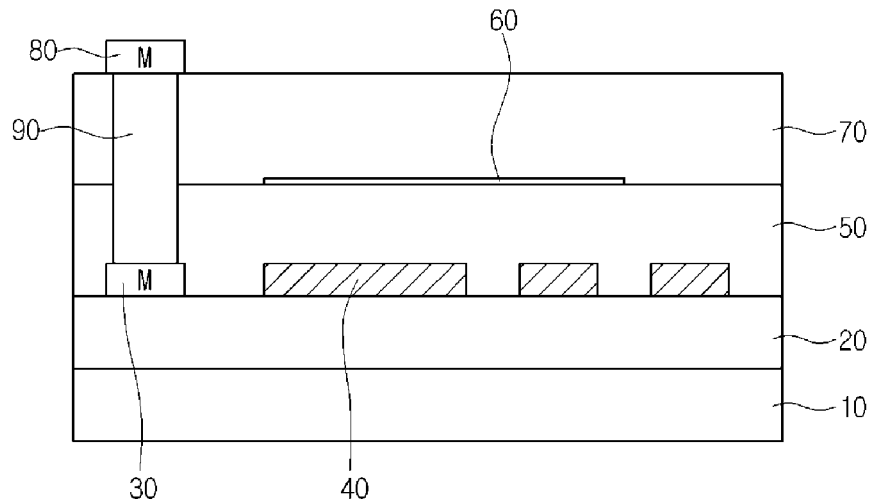
FIG. 1 is a cross-sectional view illustrating a method of forming a metal dummy pattern and a thin film resistor of a semiconductor device in the related art.
Figure 2:
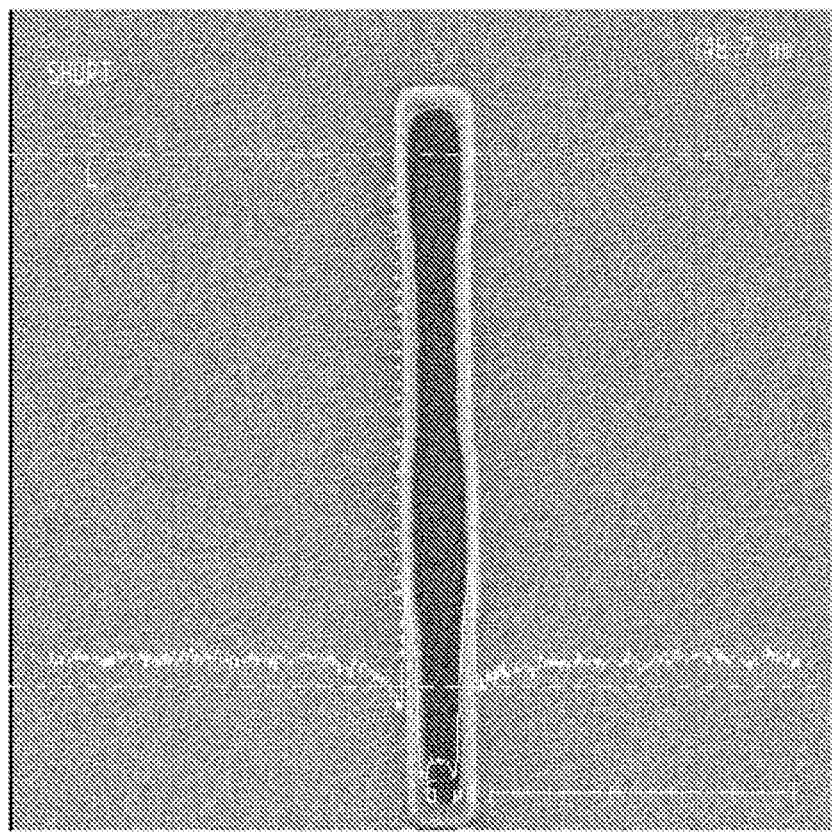
FIG. 2 is an image illustrating a pattern profile of the thin film resistor of FIG. 1.

Reference will now be made in detail to the embodiments of the present disclosure, examples of which are illustrated in the accompanying drawings.

In the description of embodiments, it will be understood that when a substrate, layer, film, or electrode is referred to as being 'on' or 'under' another substrate, layer, film, or electrode, the terminology of 'on' and 'under' includes both the meanings of 'directly' and 'indirectly'. Further, the reference about 'on' and 'under' each component will be made on the basis of drawings. In addition, the sizes of elements and the relative sizes between elements may be exaggerated for further understanding of the present disclosure.

FIGS. 3 to 6 are plan views illustrating a semiconductor device according to an embodiment. Referring to FIGS. 3 to 6, the semiconductor device includes a semiconductor substrate 100, a thin film resistor 600 disposed on the semiconductor substrate 100 and extending in a first direction, and a metal dummy pattern 400 disposed between the semiconductor substrate 100 and the thin film resistor 600. The metal dummy pattern 400 extends in the first direction, and includes a reflective pattern 410 corresponding to the periphery of the thin film resistor 600.

The thin film resistor 600 is elongated in one direction. The thin film resistor 600 extends in the first direction in FIG. 3, but is not limited thereto, and thus, may extend in a second direction or in a certain direction. The term 'extend' used in here may denote that a ratio of the major axis of a thin film resistor to the minor axis thereof is 5:1 or greater, but is not limited thereto.

The thickness of the thin film resistor 600 is very small. For example, the thin film resistor 600 may have a thickness ranging from about 5 Å to about 1000 Å. Accordingly, when a typical thin film resistor pattern is fabricated, a portion of light used in an exposure process passes through a thin film resistor, is incident to a metal dummy pattern, and is reflected to the thin film resistor, thus deforming the thin film resistor pattern. To address this issue, according to the current embodiment, the reflective pattern 410 corresponding to the metal dummy pattern 400 is provided.

The reflective pattern 410 corresponds to the periphery of the thin film resistor 600 to uniformly reflect light passing through the thin film resistor 600, to the thin film resistor 600, so that the thin film resistor 600 can have a regular profile.

The reflective pattern 410 is disposed on the semiconductor substrate 100. In detail, the reflective pattern 410 may be coplanar with the metal dummy pattern 400 disposed on the semiconductor substrate 100.

When the metal dummy pattern 400 is constituted by a plurality of layers, the reflective pattern 410 may be coplanar with the uppermost one of the layers. That is, the reflective pattern 410 may be disposed at any position, provided that the reflective pattern 410 is coplanar with the nearest region of the metal dummy pattern 400 to the thin film resistor 600.

The reflective pattern 410 may be formed while the metal dummy pattern 400 is formed. That is, while the metal dummy pattern 400 is fabricated on the semiconductor substrate 100, a portion of the metal dummy pattern 400 may be patterned to correspond to the thin film resistor 600, thereby fabricating the reflective pattern 410.

The reflective pattern 410 and the thin film resistor 600 extend in the same direction. For example, referring to FIG. 3, the reflective pattern 410 may extend in the first direction.

Figure 3:
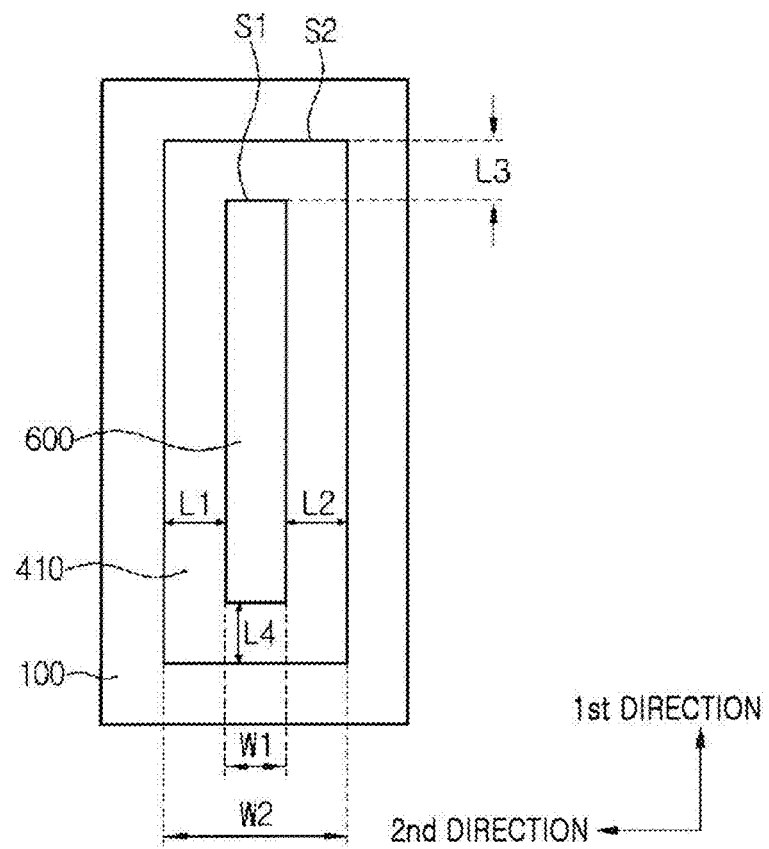
FIGS. 3 to 6 are plan views illustrating a semiconductor device according to an embodiment.

The reflective pattern 410 corresponds to the thin film resistor 600. Particularly, the reflective pattern 410 may correspond to the periphery of the thin film resistor 600. For example, the reflective pattern 410 may be disposed under the thin film resistor 600, and correspond to the periphery of the thin film resistor 600. The reflective pattern 410 may overlap the thin film resistor 600 Furthermore, the reflective pattern 410 and the thin film resistor 600 may overlap the semiconductor substrate 100. That is, as shown in FIG. 3, which is a plan view, the semiconductor substrate 100, the reflective pattern 410, and the thin film resistor 600 decrease in width, as a whole, in a direction away from the semiconductor substrate 100, to thereby form a stepped shape.

In detail, in the plan view, the thin film resistor 600 disposed on the reflective pattern 410 may be positioned within and overlap the reflective pattern 410, and the reflective pattern 410 disposed on the semiconductor substrate 100 may be positioned within and overlap the semiconductor substrate 100. For example, the reflective pattern 410 may overlap the thin film resistor 600, and a width W2 of the reflective pattern 410 may be greater than a width W1 the thin film resistor 600, but the present disclosure is not limited thereto.

A periphery S1 of the thin film resistor 600 may be disposed inside a periphery S2 of the reflective pattern 410. In this case, the periphery S2 of the reflective pattern 410 may be spaced apart from the periphery S1 of the thin film resistor 600 by predetermined distances L1 to and L4. That is, the periphery S2 of the reflective pattern 410 may be wider by a predetermined distance than periphery S1 of the thin film resistor 600. For example, when the width W1 of the thin film resistor 600 is about 1.2 μm, the width W2 of the reflective pattern 410 may be about 1.8 μm, but is not limited thereto.

The distances L1 to L4 are not limited to specific values, and may be appropriately determined according to the width W1 of the thin film resistor 600 and the width W2 of the reflective pattern 410. The distances L1 to L4 are the same in FIG. 3, but are not limited thereto, and thus, may be different from each other.

As described above, since the reflective pattern 410 corresponds to the periphery of the thin film resistor 600, the thin film resistor 600 can have a regular profile. Accordingly, the semiconductor device can have stable resistance characteristics, and a mismatch issue thereof can be addressed.

The reflective pattern 410 has no inner space, but the present disclosure is not limited thereto. That is, the reflective pattern 410 may include an inner space, e.g., an opening 411.

When a thin film resistor has a large area, a reflective pattern corresponding to the thin film resistor should have a large area, and thus, stress applied to the reflective pattern may be increased. To address this issue, when the thin film resistor 600 has a large area, the reflective pattern 410 corresponding to the thin film resistor 600 may have the opening 411, thereby decreasing stress applied to the reflective pattern 410, and reducing a fabricating cost.

Figure 4:
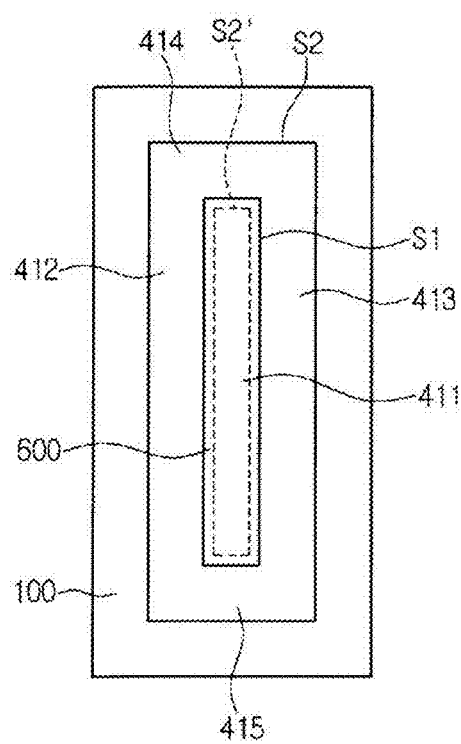

Referring to FIG. 4, the reflective pattern 410 may include the opening 411 in a closed loop. For example, the reflective pattern 410 may have a ring shape. For example, the reflective pattern 410 including the opening 411 in a closed loop may be formed by forming a metal dummy pattern on the semiconductor substrate 100, and then, removing a metal dummy corresponding to the opening 411 according to a generation rule, but is not limited thereto.

Referring to FIG. 4, the reflective pattern 410 is disposed on the semiconductor substrate 100 and includes the opening 411, and the thin film resistor 600 is disposed on the reflective pattern 410.

The semiconductor substrate 100, the reflective pattern 410 including the opening 411, and the thin film resistor 600 overlap one another. For example, the reflective pattern 410 disposed on the semiconductor substrate 100 and including the opening 411 may be positioned inside and overlap the semiconductor substrate 100, and the thin film resistor 600 disposed on the reflective pattern 410 may be positioned inside and overlap the reflective pattern 410.

In detail, the opening 411 may be disposed inside the periphery S1 of the thin film resistor 600. For example, a periphery S2' of the opening 411 may be disposed inside the periphery S1 of the thin film resistor 600. The periphery S2' of the opening 411 and the periphery S1 of the thin film resistor 600 may be disposed inside the periphery S2 of the reflective pattern 410.

The opening 411 is not limited to specific size and shape, and thus, may be appropriately determined according to the width W1 of the thin film resistor 600 and the width W2 of the reflective pattern 410. For example, when the width W1 of the thin film resistor 600 is about 1.2 μm, and the width W2 of the reflective pattern 410 may be about 1.8 μm, a width W3 of the opening 411 may range from about 0.4 μm to about 0.7 μm, but is not limited thereto.

Referring to FIG. 4, the reflective pattern 410 having a closed loop extends in the first direction, and may include a first extension 412 and a first prime extension 413, which face each other, and a first connection 414 and a first prime connection 415, which connect ends of the first extension 412 and the first prime extension 413.

The reflective pattern 410 is a single part, but is not limited thereto. That is, the reflective pattern 410 may be provided in a pair, or may include a plurality of reflective patterns spaced apart from each other. In this case, a contact area of the reflective pattern 410 is decreased to reduce the stress applied to the reflective pattern 410, and the fabricating cost.

Figure 5:
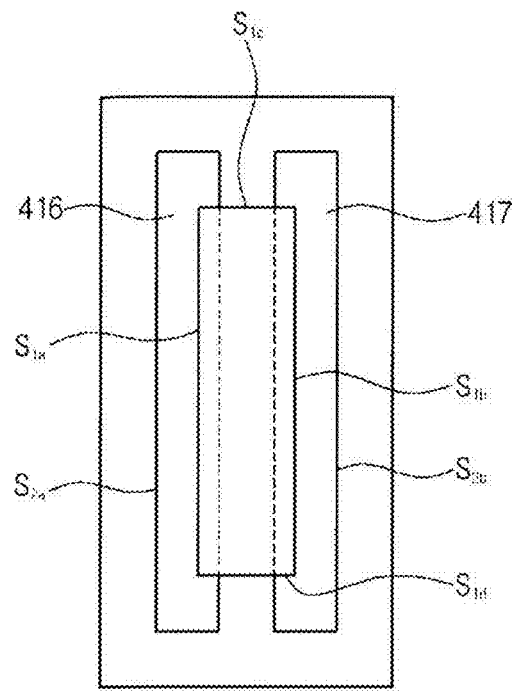
Figure 6:
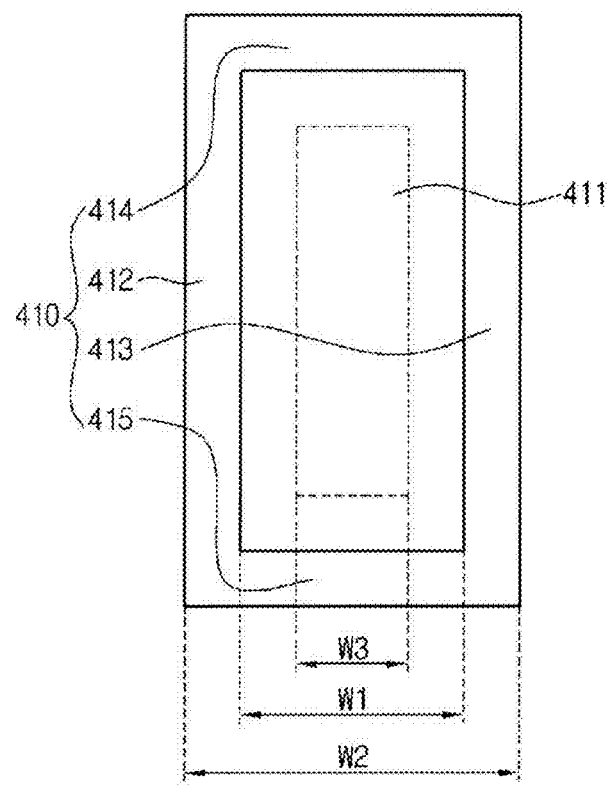

Referring to FIG. 5, the reflective pattern 410 may include a first reflective pattern 416 and a second reflective pattern 417. The first reflective pattern 416 and the second reflective pattern 417 may be spaced a predetermined distance from each other, and face each other. In detail, the first reflective pattern 416 and the second reflective pattern 417 may be opposed to each other with respect to the thin film resistor 600.

The first reflective pattern 416 and the second reflective pattern 417 may correspond to the thin film resistor 600. In detail, the first reflective pattern 416 corresponds to and overlaps a first periphery $S_{1a}$ of the thin film resistor 600 extending in the first direction. The second reflective pattern 417 corresponds to and overlaps a second periphery $S_{1b}$ of the thin film resistor 600 extending in the first direction.

For example, the first periphery $S_{1a}$ of the thin film resistor 600 may be disposed inside a periphery $S_{2a}$ of the first reflective pattern 416. The second periphery $S_{1b}$ of the thin film resistor 600 may be disposed inside a periphery $S_{2b}$ of the second reflective pattern 417.

The reflective pattern 410 has a shape corresponding to the thin film resistor 600 as described above, but is not limited thereto. That is, referring to FIG. 7, the metal dummy pattern 400 may include metal dummies 420 as well as the reflective pattern 410. The metal dummies 420 are any typical metal dummies used in the art, and are not limited to a specific position and shape. That is, the metal dummies 420 may be disposed regularly or irregularly. For example, the irregularly arrayed metal dummies 420 may be disposed outside and inside the opening 411, but are not limited thereto. The metal dummies 420 may be disposed between the first and second reflective patterns 416 and 417, but are not limited thereto.

The metal dummies 420 may be coplanar with the metal dummy pattern 400, or may be disposed in a different plane from that of the metal dummy pattern 400. For example, the semiconductor device may include a second metal dummy pattern between the semiconductor substrate 100 and the metal dummy pattern 400, but is not limited thereto.

As such, since a metal dummy pattern is selectively formed according to density of a metal disposed on a semiconductor substrate, a semiconductor device having uniform density can be formed, and a height difference between certain portions in a chemical mechanical polishing (CMP) process can be reduced to thereby form a uniform semiconductor device.

Figure 7:
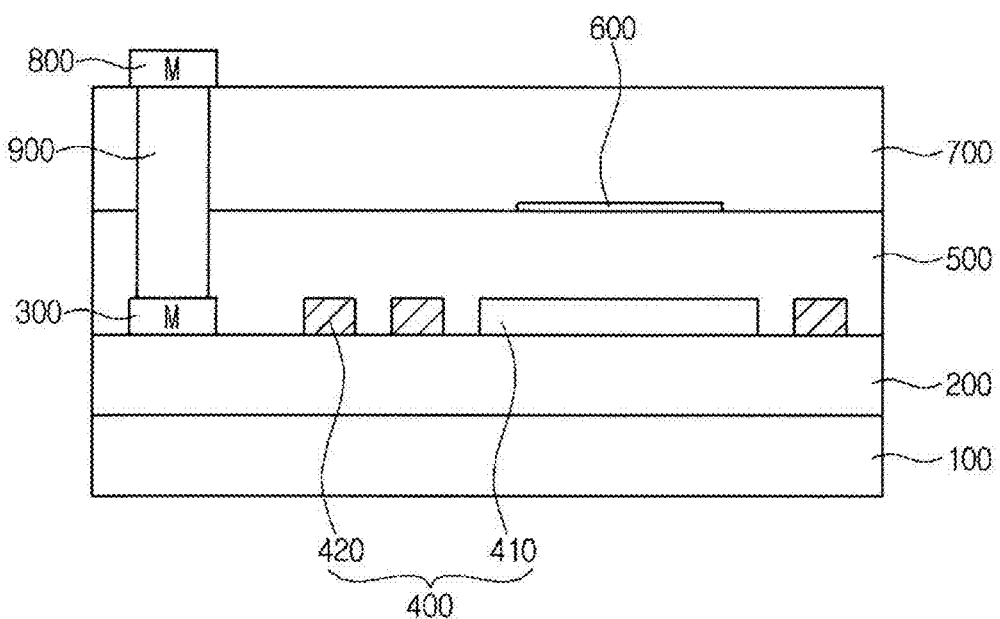
FIG. 7 is a cross-sectional view illustrating a metal dummy pattern and a thin film resistor of a semiconductor device according to an embodiment.

FIG. 7 is a cross-sectional view illustrating the semiconductor device including the reflective pattern and the thin film resistor.

Referring to FIG. 7, the semiconductor device includes: a first dielectric 200 disposed on the semiconductor substrate 100; a lower interconnection 300 and the metal dummy pattern 400, which are disposed on the first dielectric 200; a second dielectric 500 disposed on the lower interconnection 300 and the metal dummy pattern 400; the thin film resistor 600 disposed on the second dielectric 500 and having first to fourth peripheries (not shown); a third dielectric 700 disposed on the thin film resistor 600; an upper interconnection 800 disposed on the third dielectric 700; and a via 900 passing through the second dielectric 500 and connecting the lower interconnection 300 to the upper interconnection 800. The metal dummy pattern 400 includes the reflective pattern 410 corresponding to the first to fourth peripheries of the thin film resistor 600. As described above, any two of the first to fourth peripheries of the thin film resistor 600 may extend in a certain direction, but the thin film resistor 600 is not limited thereto.

That is, the thin film resistor 600 may not extend in a certain direction. Particularly, the first to fourth peripheries may be substantially the same in length. For example, the ratio of the major axis of the thin film resistor 600 to the minor axis thereof may be 5:1 or less, but is not limited thereto.

In this case, the reflective pattern 410 may overlap the thin film resistor 600 That is, the first to fourth peripheries of the thin film resistor 600 may be disposed inside the reflective pattern 410. For example, the periphery of the reflective pattern 410 may be spaced a predetermined distance from the first to fourth peripheries of the thin film resistor 600. The reflective pattern 410 may be wider than the thin film resistor 600.

As described above, since a reflective pattern corresponds to a thin film resistor, a uniform metal dummy pattern having uniform density, and a semiconductor device having a regular profile can be formed. Accordingly, the semiconductor device can have stable resistance characteristics, and a mismatch issue thereof can be addressed.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

What is claimed is:

1. A semiconductor device comprising:
   a semiconductor substrate;
   a thin film resistor disposed over the semiconductor substrate and extending in a first direction relative to the semiconductor substrate; and
   a metal dummy pattern disposed between the semiconductor substrate and the thin film resistor, the metal dummy pattern including a reflective pattern extending in the first direction relative to the semiconductor substrate and spatially corresponding to a periphery of the thin film resistor, wherein the reflective pattern includes an opening in a closed loop.

2. The semiconductor device of claim 1, wherein the reflective pattern and the thin film resistor overlap each other such that the thin film resistor is disposed inside the periphery of the reflective pattern.

3. The semiconductor device of claim 2, wherein a periphery of the reflective pattern is spaced a predetermined distance from the periphery of the thin film resistor.

4. The semiconductor device of claim 1, wherein a width of the reflective pattern is greater than a width of the thin film resistor.

5. The semiconductor device of claim 1, wherein the opening is disposed inside the periphery of the thin film resistor.

6. The semiconductor device of claim 1, wherein the reflective pattern in the closed loop comprises:

a first extension and a second extension which extend in parallel to each other; and a first connection and a second connection which connect the first extension and the second extension to each other.

7. The semiconductor device of claim 1, wherein the metal dummy pattern comprises metal dummy patterns being coplanar with the reflective pattern.

8. The semiconductor device of claim 1, wherein the thin film resistor has a thickness ranging from about 5 Å to about 1000 Å.

9. A semiconductor device comprising:
a semiconductor substrate;
a thin film resistor disposed over the semiconductor substrate and extending in a first direction relative to the semiconductor substrate; and
a metal dummy pattern disposed between the semiconductor substrate and the thin film resistor, the metal dummy pattern including a reflective pattern extending in the first direction relative to the semiconductor substrate and spatially corresponding to a periphery of the thin film resistor,
wherein the thin film resistor comprises a first periphery and a second periphery which extend in the first direction,
wherein the reflective pattern comprises a first reflective pattern and a second reflective pattern which correspond to the first peripheries and the second periphery, respectively.

10. The semiconductor device of claim 9, wherein the first reflective pattern and the second reflective pattern face each other.

11. The semiconductor device of claim 9, wherein:
the first periphery is disposed inside a periphery of the first reflective pattern; and
the second periphery is disposed inside a periphery of the second reflective pattern.

12. A semiconductor device comprising:
a semiconductor substrate;
a thin film resistor disposed over the semiconductor substrate; and
a metal dummy pattern including a reflective pattern disposed between the semiconductor substrate and the thin film resistor, the reflective pattern having an opening,
wherein the outer periphery of the opening of the reflective pattern is spatially disposed within the outer periphery of the thin film resistor and the outer periphery of the thin film resistor is spatially disposed within the outer periphery of the reflective pattern.

13. The semiconductor device of claim 12, wherein:
the width of the thin film resistor is about 1.2 μm;
the width of the reflective pattern is about 1.8 μm; and
the width of the opening is in a range from about 0.4 μm to about 0.7 μm.

14. A semiconductor device comprising:
a semiconductor substrate;
a thin film resistor disposed over the semiconductor substrate, the thin film resistor defined by a first outer periphery and a second outer periphery; and
a first reflective pattern disposed under the thin film resistor, the first reflective pattern having a third outer periphery;
a second reflective pattern disposed under the thin film resistor and spaced apart a predetermined distance from the first reflective pattern, the second reflective pattern having a fourth outer periphery,
wherein the first outer periphery is disposed inside the third outer periphery of the first reflective pattern and the second outer periphery is disposed inside the fourth outer periphery of the second reflective pattern.

15. The semiconductor device of claim 14, wherein the first reflective pattern and the second reflective pattern are opposed to each with respect to the thin film resistor.

16. The semiconductor device of claim 14, wherein the first reflective pattern and the second reflective pattern extend in parallel to each other.

17. The semiconductor device of claim 14, further comprising:
a first dielectric layer disposed over the semiconductor substrate, wherein the metal dummy pattern is disposed over the first dielectric layer;
a lower interconnection disposed over the first dielectric layer;
a second dielectric layer disposed over the lower interconnection and the metal dummy pattern, wherein the thin film resistor is disposed over the second dielectric layer;
a third dielectric layer disposed over the thin film resistor;
an upper interconnection disposed over the third dielectric layer; and
a via passing through the second and third dielectric layers and connecting the lower interconnection to the upper interconnection.

* * * * *